(12) United States Patent
Nakada et al.

(10) Patent No.: US 8,264,231 B2
(45) Date of Patent: Sep. 11, 2012

(54) SWITCH CIRCUIT

(75) Inventors: Mitsuru Nakada, Tokyo (JP); Masaaki Takesue, Tokyo (JP)

(73) Assignee: Sony Corporation, Tokyo (JP)

( * ) Notice: Subject to any disclaimer, the term of this patent is extended or adjusted under 35 U.S.C. 154(b) by 423 days.

(21) Appl. No.: 12/553,541

(22) Filed: Sep. 3, 2009

(65) Prior Publication Data

US 2010/0090746 A1    Apr. 15, 2010

(30) Foreign Application Priority Data

Oct. 15, 2008   (JP) ................................. 2008-265858

(51) Int. Cl.
     *G01R 31/327*      (2006.01)
     *H03M 11/00*      (2006.01)
     *G06F 3/02*      (2006.01)

(52) U.S. Cl. .............. 324/415; 341/20; 341/22; 341/26; 345/168; 345/169

(58) Field of Classification Search .................. 324/415, 324/678; 327/365; 341/20–35; 345/168–169
See application file for complete search history.

(56) References Cited

U.S. PATENT DOCUMENTS

| | | | | |
|---|---|---|---|---|
| 4,884,070 A | * | 11/1989 | Hannaford | 340/13.38 |
| 5,057,699 A | * | 10/1991 | Spence | 307/98 |
| 5,619,196 A | * | 4/1997 | Escobosa | 341/22 |

FOREIGN PATENT DOCUMENTS

| | | |
|---|---|---|
| JP | 63-43217 | 2/1988 |
| JP | 6-36643 | 2/1994 |
| JP | 9-204254 | 8/1997 |
| JP | 10-229327 | 8/1998 |
| JP | 63-211418 | 9/1998 |
| JP | 2000-3630 | 1/2000 |
| JP | 2005-284446 | 10/2005 |
| JP | 2006-180186 | 7/2006 |
| JP | 2008-131284 | 6/2008 |

OTHER PUBLICATIONS

O. Feely, Transient Analysis, Wiley Encyclopedia of Electrical and Electronics Engineering, 1999.*

* cited by examiner

*Primary Examiner* — Melissa Koval
*Assistant Examiner* — Daniel Miller
(74) *Attorney, Agent, or Firm* — Oblon, Spivak, McClelland, Maier & Neustadt, L.L.P.

(57) ABSTRACT

A switch circuit includes: a first charge/discharge circuit having a fixed first time constant; a second charge/discharge circuit having a second time constant associated with the operation statuses of a plurality of switches; first and second input/output ports to which the first and second charge/discharge circuits are connected, respectively; and a control section adapted to measure the first and second time constants by charging or discharging the first and second charge/discharge circuits and determine the operation statuses of a plurality of switches based on the ratio of the measured first and second time constants.

12 Claims, 12 Drawing Sheets

FIG. 6

| 32 | 16 | 8 | 4 | 2 | 1 | |
|---|---|---|---|---|---|---|
| S6 | S5 | S4 | S3 | S2 | S1 | Rx |
| 1 | 1 | 1 | 1 | 1 | 1 | 63 |
| 1 | 1 | 1 | 1 | 1 | 0 | 62 |
| 1 | 1 | 1 | 1 | 0 | 1 | 61 |
| 1 | 1 | 1 | 1 | 0 | 0 | 60 |
| ... | ... | ... | ... | ... | ... | ... |
| 0 | 0 | 0 | 0 | 1 | 0 | 2 |
| 0 | 0 | 0 | 0 | 0 | 1 | 1 |
| 0 | 0 | 0 | 0 | 0 | 0 | 0 |

FIG. 7

| 243 | 81 | 27 | 9 | 3 | 1 | |
|---|---|---|---|---|---|---|
| S6 | S5 | S4 | S3 | S2 | S1 | Rx |
| 1 | 1 | 1 | 1 | 1 | 1 | 364 |
| 1 | 1 | 1 | 1 | 1 | 0 | 363 |
| 1 | 1 | 1 | 1 | 0 | 1 | 361 |
| 1 | 1 | 1 | 1 | 0 | 0 | 360 |
| ... | ... | ... | ... | ... | ... | ... |
| 0 | 0 | 0 | 0 | 1 | 0 | 3 |
| 0 | 0 | 0 | 0 | 0 | 1 | 1 |
| 0 | 0 | 0 | 0 | 0 | 0 | 0 |

SWITCH CIRCUIT

BACKGROUND OF THE INVENTION

1. Field of the Invention

The present invention relates to a switch circuit which includes a plurality of switches and an information processing device for detecting operation statuses of the switches.

2. Description of the Related Art

A plurality of key switches are provided on the operation panel of electronic equipment such as television set or within the casing thereof. The operation statuses of the key switches are determined, for example, by an information processing device such as embedded microcomputer. The term "operation statuses of the key switches" refers to the ON/OFF statuses of the key switches. Unlike general-purpose computers, embedded microcomputers are designed primarily to control equipment and incorporate I/O (input/output) ports, an A/D (analog-to-digital) converter, a D/A (digital-to-analog) converter and other components in addition to a CPU (Central Processing Unit).

A first example of a known switch circuit (direct type) is shown in FIG. 1. Two series circuits are connected between a line, supplied with a positive source voltage, and ground. One of the series circuit has a pull-up resistor R10 and key switch S10. The other series circuit has a pull-up resistor R20 and key switch S20. The connection points respectively between the pull-up resistor R10 and key switch S10 and the pull-up resistor R20 and key switch S20 are connected to I/O ports of an information processing device 1. The information processing device 1 can determine the operation status of each key switch by determining whether the voltage level of the I/O port is high or low. The first example requires as many I/O ports as the total number of key switches, possibly resulting in an increased number of I/O ports for systems using a large number of key switches.

A second example of a known switch circuit (key matrix) is shown in FIG. 2. Key switches S11, S12, S21 and S22 are connected respectively at the intersections between an input line I1 and an output line O1, the input line I1 and an output line O2, an input line I2 and the output line O1, and the input line I2 and the output line O2. One of the output lines such as the line O1 is pulled up to high level. When the key switches S11 and S21 connected to the output line O1 are OFF, the input lines I1 and I2 are pulled down to low level. When the key switches S11 and S21 are ON, the input lines I1 and I2 are pulled up to high level. Key matrix allows for the determination of the operation statuses of a plurality of key switches at the same time. Key matrix provides a reduced number of I/O ports required for the total number of key switches as compared to the first type (direct type).

A third example of a known switch circuit (voltage detection type) is shown in FIG. 3. Such a circuit is described, for example, in Japanese Patent Laid-Open No. 2008-131284.

A connection point A which is connected to a line supplied with a positive source voltage via a pull-up resistor 30 is grounded via a key switch S31. An anti-chatter capacitor C10 is connected in parallel with the key switch S31. Further, the connection point A is grounded via a series circuit, which has resistors R31, R32, R33, R34 and R35, and a key switch S36. The voltage level of the connection point A serves as an input voltage of an A/D converter 1a of the information processing device 1.

When one of the key switches S31 to S36 turns ON, the voltage of the connection point A changes to a level associated with the key switch which has turned ON. This voltage level is converted to digital data by the A/D converter 1a, after which the information processing device 1 determines, based on the digital data, which key switch has turned ON.

The third example is problematic in that it cannot detect the simultaneous activation of a plurality of key switches, making it limited in its application. The third example provides a reduced number of I/O ports as compared to the second example (key matrix). However, this example requires an A/D converter port which can receive an analog voltage input. As a result, a general-purpose I/O port GPIO (General Purpose Input Output) cannot be used. A general-purpose I/O port can only determine whether the input analog voltage is at high or low level.

A fourth example of a known switch circuit (voltage detection type) is shown in FIG. 4. The voltage level of the connection point A serves as an analog voltage input of the A/D converter 1a of the information processing device 1. A pull-up resistor R40 is connected to the connection point A. Three series circuits are also connected to the connection point A. One of these series circuits has a pull-up resistor R41 and key switch S41, another a pull-up resistor R42 and key switch S42, and still another a pull-up resistor R43 and key switch S43. The parallel combined resistance changes according to a key switch which turns ON among the key switches S41 to S43, whereby the voltage at the connection point A changes. Therefore, if the analog voltage level of the connection point A is fed to the A/D converter 1a, the information processing device 1 can determine the operation statuses of the key switches.

The fourth example can detect the simultaneous activation of two or more of a plurality of key switches. In order to increase the number of key switches connected to the A/D converter port, however, the resistances must be accurate. As a result, the selection of resistors is cumbersome, making it difficult to increase the number of key switches. Although the fourth example provides a reduced number of I/O ports as compared to the second example (key matrix), this example requires an A/D converter port which can receive an analog voltage input. As a result, a general-purpose I/O port cannot be used.

SUMMARY OF THE INVENTION

As described above, the first and second examples of the known switch circuit can be configured only with a general-purpose I/O port unlike the third and fourth examples. However, the first and second examples have a drawback in that the number of ports tends to be larger than that in the third and fourth examples. The third example cannot determine the operation statuses of two or more key switches at the same time. The fourth example can determine the operation statuses of two or more key switches at the same time. However, the resistances must be accurate to increase the number of key switches whose operation statuses are to be determined. Although providing a reduced number of ports, the third and fourth examples require an A/D converter port which cannot be incorporated in all types of the information processing device 1.

In light of the foregoing, it is preferable to provide a switch circuit which can solve the aforementioned problem.

In order to solve the aforementioned problem, a switch circuit according to an embodiment of the present invention includes a first charge/discharge circuit having a fixed first time constant. The switch circuit further includes a second charge/discharge circuit having a second time constant associated with the operation statuses of a plurality of switches. The switch circuit still further includes first and second I/O ports to which the first and second charge/discharge circuits are connected, respectively. The switch circuit still further includes a control section. The control section measures the first and second time constants by charging or discharging the first and second charge/discharge circuits and determines the operation statuses of a plurality of switches based on the ratio of the measured first and second time constants.

The control section measures the first and second time constants via the first and second I/O ports.

The control section includes a third I/O port and measures the first and second time constants via the third I/O port.

The first charge/discharge circuit includes a reference resistor having a fixed resistance and a first capacitor. The second charge/discharge circuit includes a series circuit, a plurality of switches and a second capacitor. The series circuit has a plurality of resistors. The plurality of switches are each connected in parallel with one of the plurality of resistors. The combined resistances of the plurality of resistors are in a one-to-one correspondence with the operation statuses of the plurality of switches.

The plurality of resistances differ from each other and are each a power of 2.

A single common capacitor may be used as the first and second capacitors.

An element is connected in parallel with the reference resistor. The element forms a discharge path of the common capacitor.

The first charge/discharge circuit includes a reference capacitor having a fixed capacitance and a first resistor. The second charge/discharge circuit includes a plurality of capacitors, a plurality of switches and a second resistor. The plurality of switches are each connected in series with one of the capacitors.

The switch circuit according to the present invention offers the following advantages over the known switch circuits.

The present circuit can determine the statuses of two or more key switches at the same time.

The present circuit provides a reduced number of I/O ports of the information processing device required to determine the statuses of a plurality of switches as compared to the known one.

The present circuit can use a general-purpose I/O port rather than an A/D converter port.

According to the embodiments of the present invention, all possible combinations of statuses of the keys are distributed along the time axis. This makes it possible to increase the number of switches assigned to each port to the extent that the time required to determine the switch statuses will not be excessively long.

BRIEF DESCRIPTION OF THE DRAWINGS

FIG. 6 is a schematic diagram illustrating an example of resistances in the first embodiment;

FIG. 7 is a schematic diagram illustrating another example of resistances in the first embodiment;

DETAILED DESCRIPTION OF THE PREFERRED EMBODIMENTS

The best modes for carrying out the present invention (hereinafter referred to as the embodiments) will be described below. It should be noted that the description will be made in the following order:
1. First embodiment
2. Second embodiment
3. Third embodiment
4. Fourth embodiment
5. Fifth embodiment It should be noted that the embodiments described below are preferred detailed examples of the present invention and involve various technically preferred limitations. However, the scope of the invention is by no means limited to these embodiments, unless otherwise described to limit the invention in the description hereinafter.

1. First Embodiment

Configuration of the First Embodiment

Figure 1:
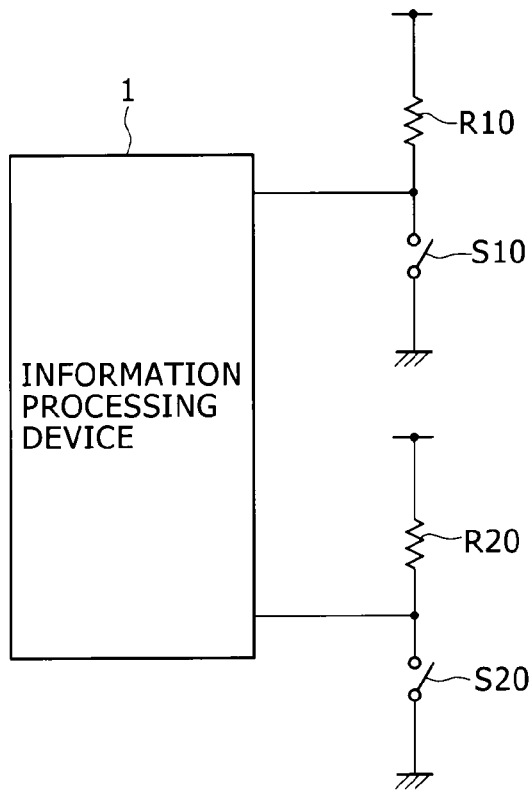
FIG. 1 is a connection diagram of a first example of a known switch circuit.
Figure 2:
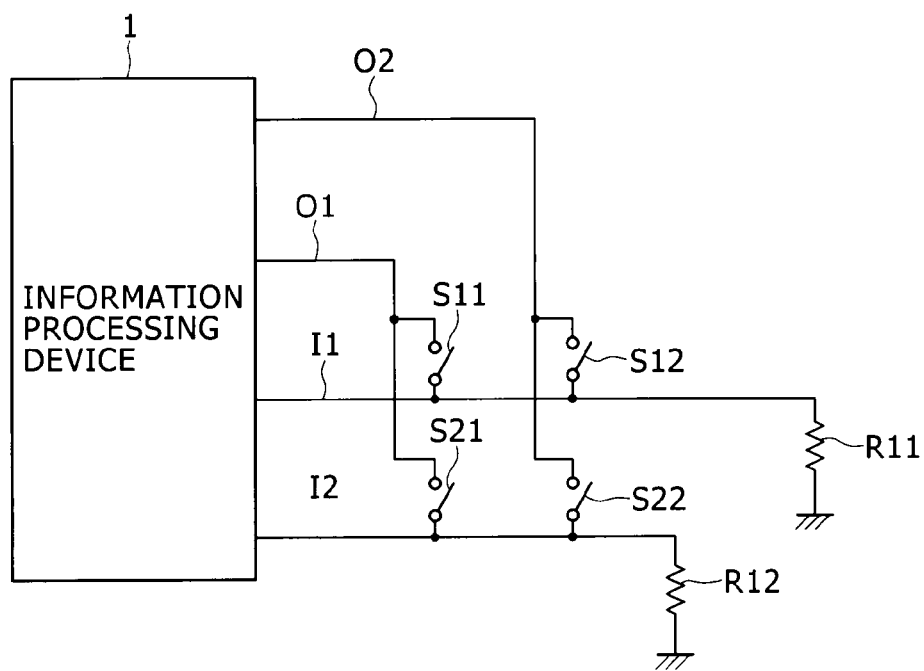
FIG. 2 is a connection diagram of a second example of a known switch circuit.
Figure 3:
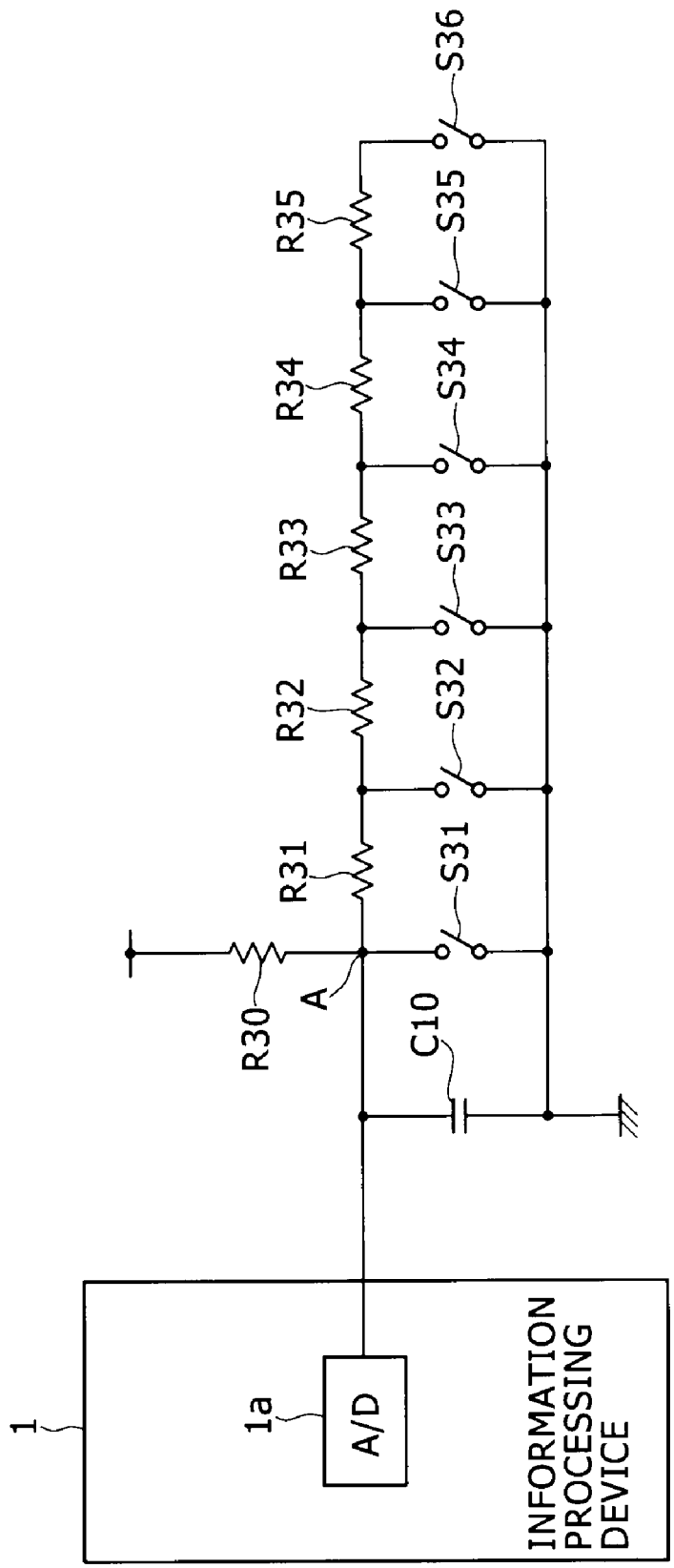
FIG. 3 is a connection diagram of a third example of a known switch circuit.
Figure 4:
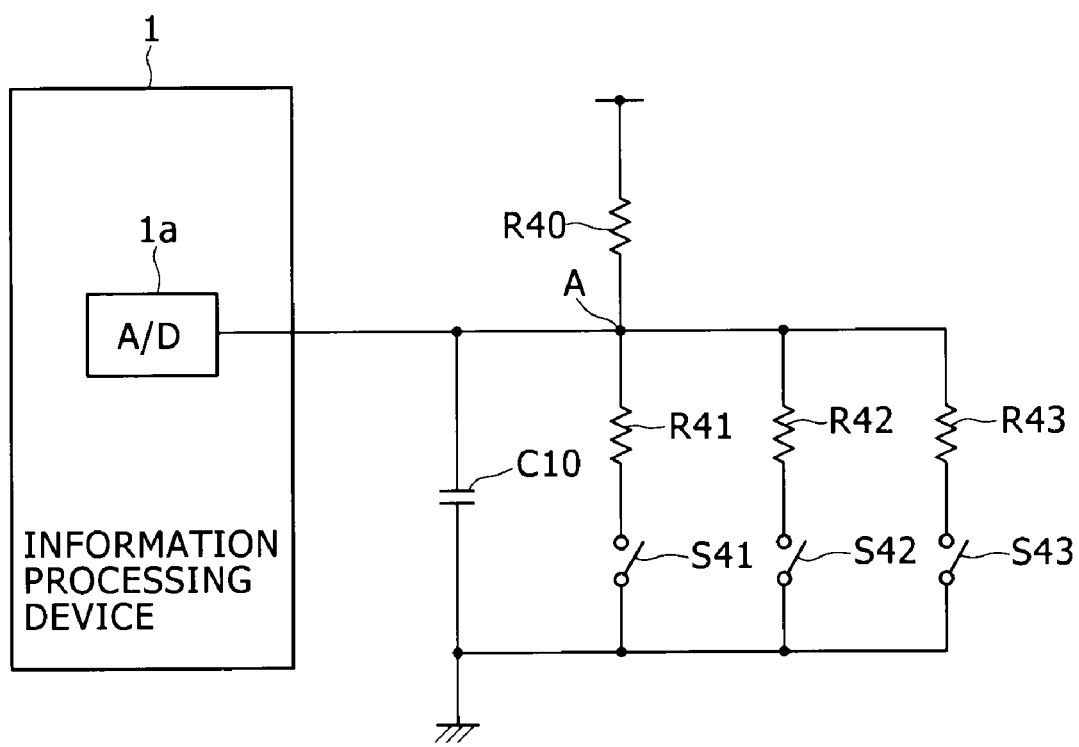
FIG. 4 is a connection diagram of a fourth example of a known switch circuit.
Figure 5:
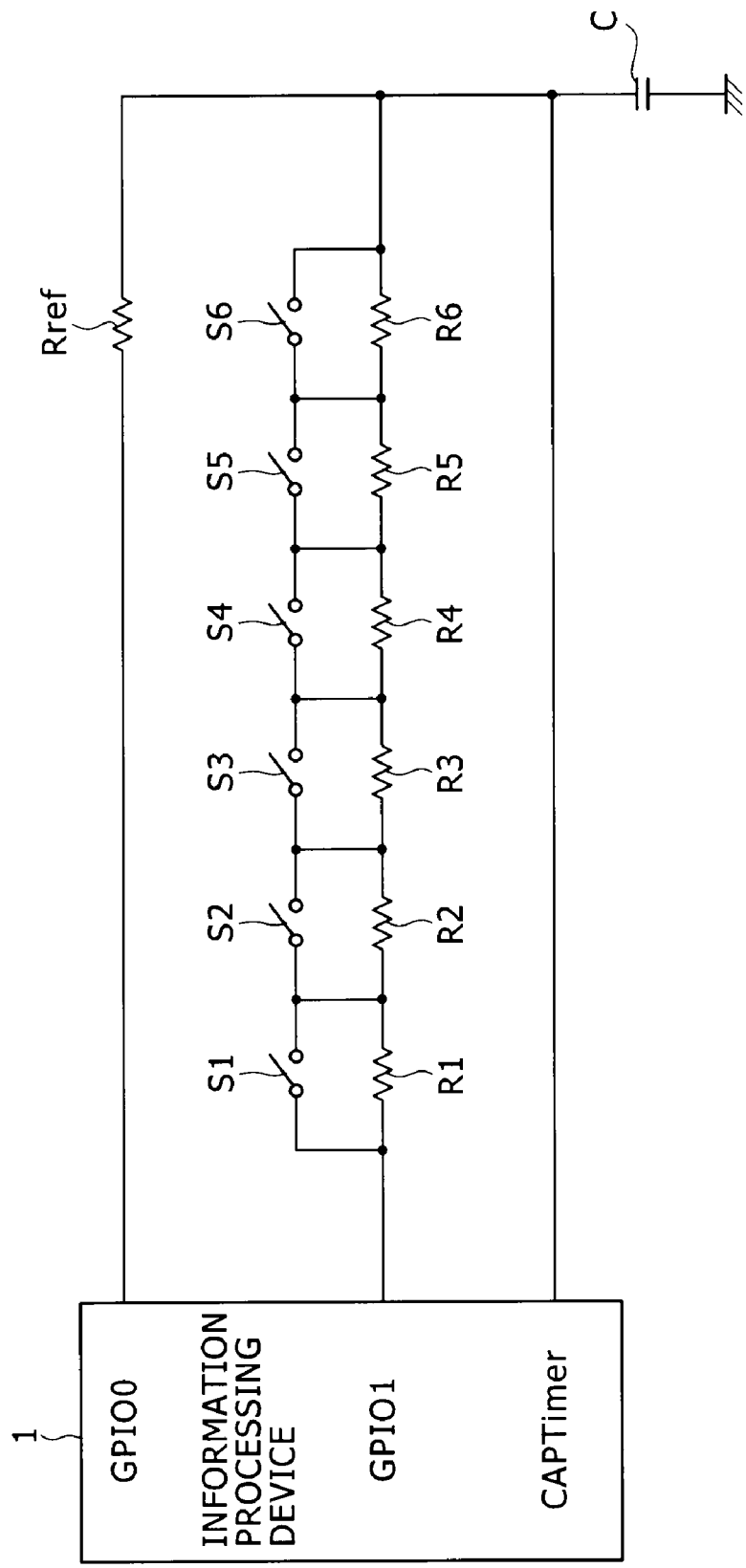
FIG. 5 is a connection diagram of a first embodiment of the present invention.

FIG. 5 illustrates the configuration of a first embodiment of the present invention. The information processing device 1 includes three general-purpose I/O ports, namely, GPIO0, GPIO1 and CAPTimer. The general-purpose I/O ports handle high- or low-level inputs or outputs. Whether the I/O ports function as input or output ports is specified by the CPU (Central Processing Unit) which functions as a control section of the information processing device 1.

That is, each of the I/O ports is selectively specified by the CPU of the information processing device 1 to be in input or output state. When the I/O port is in output state, the specified level, i.e., high or low level, is output from the I/O port. When the I/O port is in input state, the I/O port is in high impedance state. When the I/O port is in high impedance state, the capacitor terminal voltage of the charge/discharge circuit is measured.

An example of the information processing device 1 is an embedded microcomputer in electronic equipment. Unlike general-purpose computer, an embedded microcomputer controls the machine or equipment in which it is embedded. In the information processing device 1, the CPU controls a period measurement counter, ROM (Read Only Memory), RAM (Random Access Memory), A/D converter, D/A converter, timer and other components in addition to the aforementioned I/O ports. It should be noted that a programmable logic controller may be used rather than a CPU.

The I/O port GPIO0 is grounded via a reference resistor Rref and capacitor C. The I/O port GPIO1 is grounded via six resistors R1, R2, R3, R4, R5 and R6 and the capacitor C. Key switches S1, S2, S3, S4, S5 and S6 are connected each in parallel with one of the resistors. The I/O port CAPTimer is connected to the electrode of the capacitor C which is not grounded.

In the first embodiment of the present invention, a reference charge/discharge circuit includes the reference resistor Rref and capacitor C for measuring a reference charge time. Further, a charge/discharge circuit to be measured which determines the operation statuses of the key switches includes the key switches S1 to S6, resistors R1 to R6 and capacitor C.

The CPU of the information processing device 1 pulls the GPIO0 up to high level, thus charging the reference charge/discharge circuit and causing the voltage change during the charge to be measured via the CAPTimer. Next, the CPU of the information processing device 1 pulls the GPIO1 up to high level, thus charging the charge/discharge circuit to be measured and causing the voltage change during the charge to be measured via the CAPTimer. As described above, the charge is conducted in a time-shared manner.

The threshold set in advance by the CPU of the information processing device 1 is compared against the voltage during the charge. The information processing device 1 uses the threshold to determine whether the voltage during the charge is at high or low level. The time required for the voltage to reach the threshold from the beginning of the charge and make a transition from low to high level (referred to as the charge time) is associated with the charge time constant. The charge time constant of the reference charge/discharge circuit is determined by Rref and C. The charge time constant of the charge/discharge circuit to be measured is determined by the combined resistance (written as Rx; Rx is a relative value) and capacitor C. The combined resistance is determined according to the operation statuses of the key switches S1 to S6.

The CPU measures the charge time of the reference charge/discharge circuit and that of the second charge/discharge circuit (referred to as the charge/discharge circuit to be measured), thus finding the ratio between the time constant of the reference charge/discharge circuit (first time constant) and that of the charge/discharge circuit to be measured (second time constant). The information processing device 1 measures the charge times, for example, by counting the number of internal clocks with a counter.

Because the common capacitor C is shared between the reference charge/discharge circuit and charge/discharge circuit to be measured, the ratio between the two time constants is equal to the ratio between the charge resistors (Rref:Rx). The accuracy of the capacitance of the capacitor C does not affect the measurement accuracy. The common port CAPTimer is shared to measure the voltage change in each of the charge/discharge circuits. This scheme is advantageous in that the measurement is not affected by the performance difference (mainly threshold difference) between the different ports.

[Examples of Resistances]

All the combinations of the operation statuses of the key switches S1 to S6 are in a one-to-one correspondence with the combined resistances Rx. That is, the combined resistance Rx is determined uniquely by the operation statuses of the key switches. As an example, the resistances of the resistors R1 to R6 are set to powers of 2 as shown by the following relative values (ratios). The powers of 2 are suitable for processing by software. Further, as an example, the resistance of the reference resistor Rref is set equal to that of one of the resistors R1 to R6.

$R1=2^0=1$ $R2=2^1=2$ $R3=2^2=4$ $R4=2^3=8$ $R5=2^4=16$ $R7=2^5=32$

As illustrated partially in FIG. 6, the combined resistance Rx is determined uniquely by the operation statuses of the key switches S1 to S6. In FIG. 6, "0" indicates that the key switch is ON, and "1" that the key switch is OFF. When all the key switches are OFF, Rx=63. When only the key switch S1 is ON, the resistor R1 is shorted. As a result, Rx=62. When all but the key switch S1 are ON, Rx=1. The relationship between the ON and OFF statuses of the key switches and "0" and "1" can be inverted by taking the exclusive OR of a 6-bit code and the code for 63 shown in FIG. 6.

Such a setting method of the resistances of the resistors R1 to R6 is merely an example. The resistances thereof may be set in any manner as long as the method provides the combined resistances Rx which are in a one-to-one correspondence with the combinations of the operation statuses of the key switches S1 to S6. For example, the resistances of the resistors may be set to powers of 3 as shown below.

$R1=3^0=1$ $R2=3^1=3$ $R3=3^2=9$ $R4=3^3=27$ $R5=3^4=81$ $R7=3^5=243$

As illustrated partially in FIG. 7, the combined resistance Rx is determined uniquely by the operation statuses of the key switches S1 to S6. In FIG. 7, "0" indicates that the key switch is ON, and "1" that the key switch is OFF. When all the key switches are OFF, Rx=364. When only the key switch S1 is ON, the resistor R1 is shorted. As a result, Rx=363. When all but the key switch S2 are ON, Rx=3.

Operation of the First Embodiment

The combined resistance Rx is found by applying the relationship that the ratio between the time constants is equal to the ratio between the reference resistor Rref of the reference charge/discharge circuit and the combined resistance Rx of the charge/discharge circuit to be measured. Because the combined resistances Rx are in a unique one-to-one correspondence with the combinations of the operation statuses of the key switches S1 to S6, the operation statuses of the key switches S1 to S6 can be determined from the combined resistance Rx.

Figure 8:
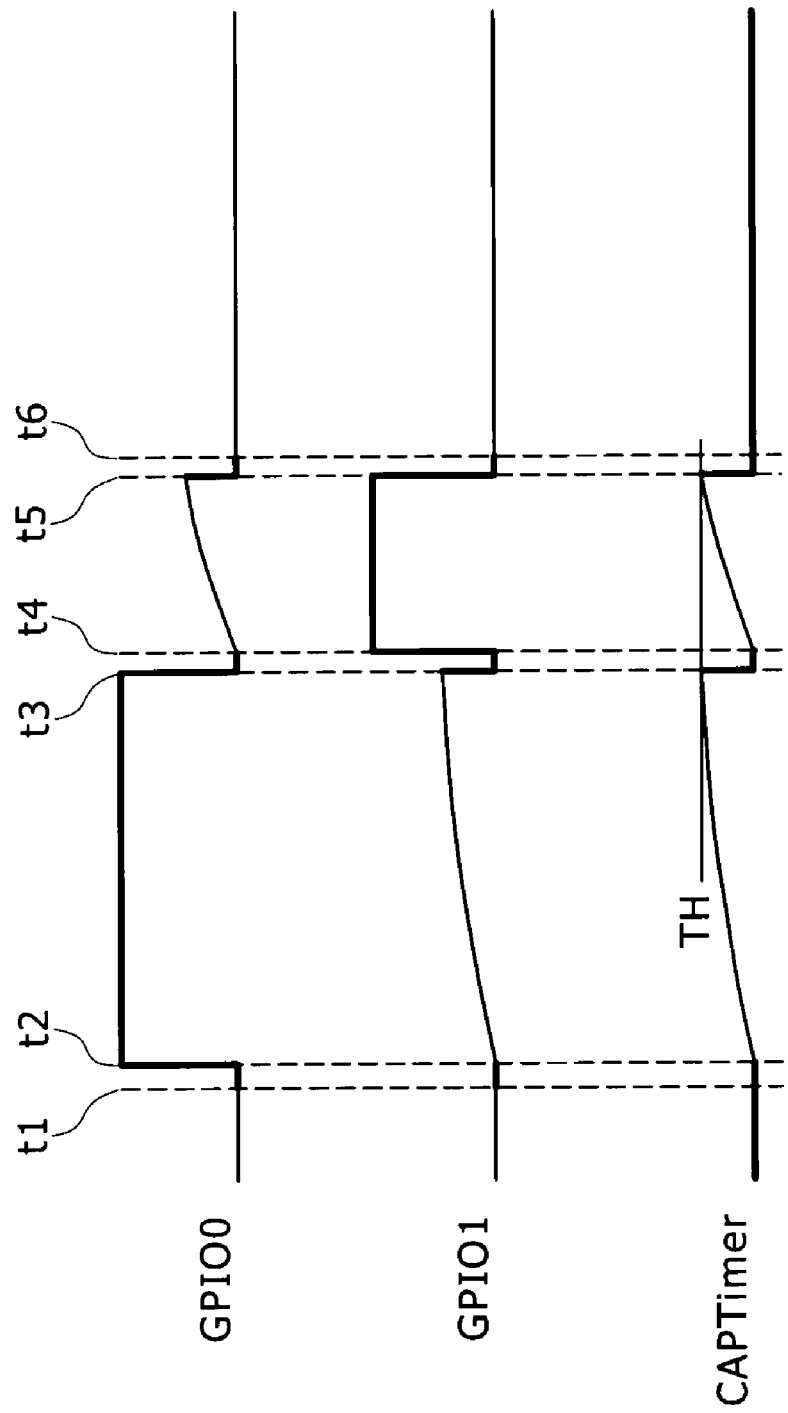
FIG. 8 is a timing diagram used to describe the operation of the first embodiment.

A description will be given below of the operation of the first embodiment of the present invention with reference to FIG. 8. FIG. 8 illustrates the states of the I/O ports GPIO0, GPIO1 and CAPTimer. Each port is specified by the CPU of the information processing device 1 to be in output or input state. When in output state, the I/O port outputs high or low level. When in input state, the I/O port is in high impedance state. In FIG. 8, the periods of the waveforms during which the ports are in output state are shown by bold lines, and the periods of the waveforms during which the ports are in input state are shown by fine lines.

During the period from time t1 to time t2, a low level is output from all the I/O ports GPIO0, GPIO1 and CAPTimer. This period is a discharge period during which the capacitor C is discharged.

Next, at time t2, the I/O port GPIO0 is pulled up to high level, and the other I/O ports GPIO1 and CAPTimer are placed in input state (high impedance state). As the I/O port GPIO0 rises to high level, the capacitor C is charged via the reference resistor Rref. As a result of the charge, the terminal voltage of the capacitor C (input voltage of the GPIO1 and CAPTimer) increases gradually with the time constant determined by the reference resistor Rref and capacitor C.

At time t3, the voltage fed to the I/O port CAPTimer reaches a threshold TH. As a result, the CPU of the information processing device 1 detects a transition of the I/O port CAPTimer from low to high level. At time t3, the CPU changes all the I/O ports GPIO0, GPIO1 and CAPTimer to low level. This causes the charge stored in the capacitor C to be discharged.

Next, at time t4, the I/O ports GPIO1 is pulled up to high level, and the other I/O ports GPIO0 and CAPTimer are placed in input state (high impedance state). As the I/O port GPIO1 rises to high level, the capacitor C is charged via the resistors connected in parallel with the key switches which are OFF (combined resistance Rx). As a result of the charge, the terminal voltage of the capacitor C (input voltage of the GPIO0 and CAPTimer) increases gradually with the time constant determined by the combined resistance Rx and capacitor C.

At time t5, the voltage fed to the I/O port CAPTimer reaches the threshold TH. As a result, the CPU of the information processing device 1 detects a transition of the I/O port CAPTimer from low to high level. At time t5, the CPU changes all the I/O ports GPIO0, GPIO1 and CAPTimer to low level. This causes the charge stored in the capacitor C to be discharged. The durations of the periods from time t1 to time t2 and from time t3 to t4 are set to the length required to discharge the capacitor C.

Two charge times, namely, a charge time Tref (t3–t2) required for the voltage during the charge of the reference charge/discharge circuit to reach the threshold TH and a charge time Tx (t5–t4) required for the voltage during the charge of the charge/discharge circuit to be measured to reach the threshold TH, are measured by the CPU. The ratio between the time constants can be found from the ratio between the charge times. Because the capacitor C is shared between the two charge/discharge circuits, the ratio between the time constants is equal to the ratio between the charge resistors.

That is, the relationship (Tref:Tx=Ref:Rx) holds. This relationship can be alternatively expressed as (Tx/Tref=Rx/Rref). The combined resistance Rx can be found from this relationship. The combined resistance Rx is associated with a combination of the operation statuses of the key switches S1 to S6. This allows for the information processing device 1 to determine the operation statuses of the key switches S1 to S6 from the combined resistance Rx. It should be noted that the ratios between the charge times (Tx/Tref) or between the resistances (Rx/Rref) may be stored in advance in memory in the form of a table so that the CPU can determine the operation statuses of the key switches by referencing the table.

The first embodiment allows for the operation statuses of two or more key switches to be determined at the same time. This embodiment also provides a reduced number of I/O ports and allows for general-purpose I/O port to be used rather than an A/D converter port. Further, this embodiment ensures improved accuracy in the measurement of charge times.

Second Embodiment

Figure 9:
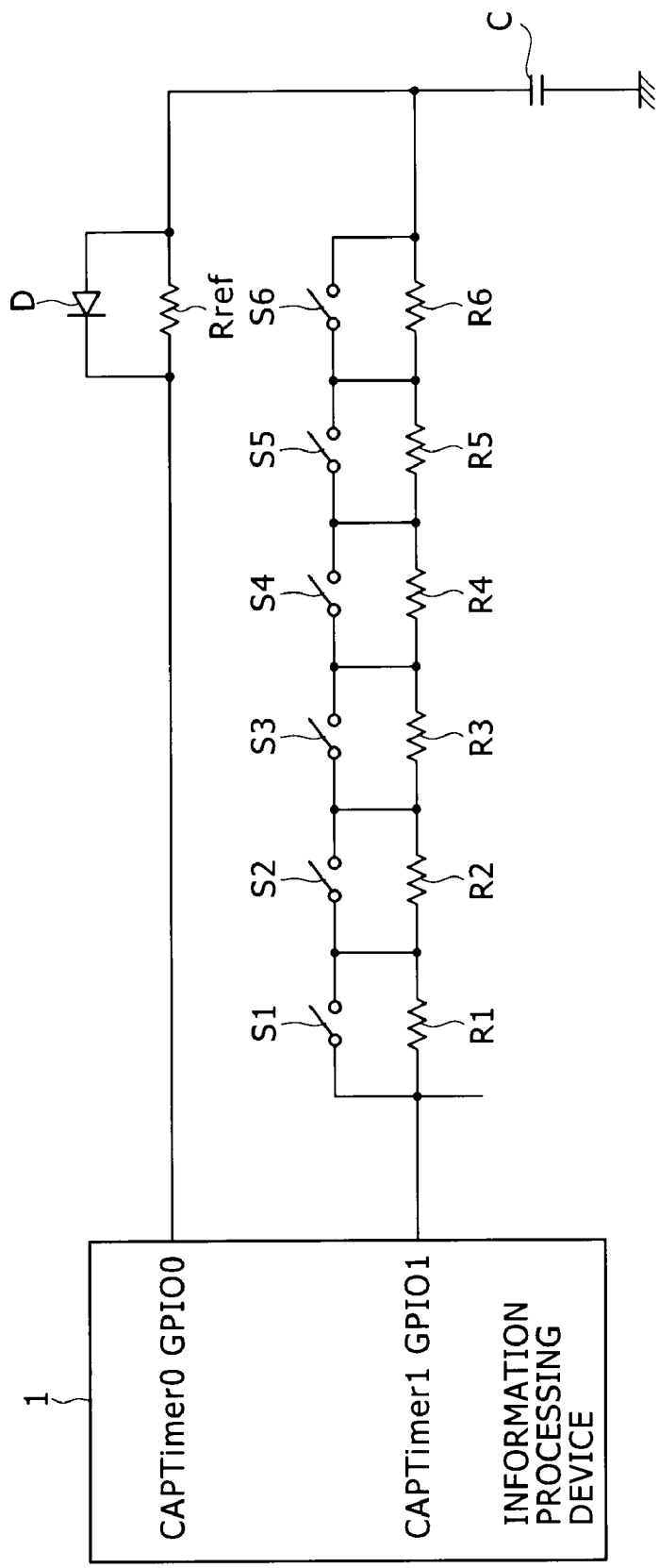
FIG. 9 is a connection diagram of a second embodiment of the present invention.

As illustrated in FIG. 9, each of the I/O ports GPIO0 and GPIO1 is used as the I/O port CAPTimer, thus providing a reduced number of ports. A diode D is connected in parallel with the reference resistor Rref. The diode D has its anode connected to the capacitor C and its cathode connected to the I/O port GPIO0.

Operation of the Second Embodiment

Figure 10:
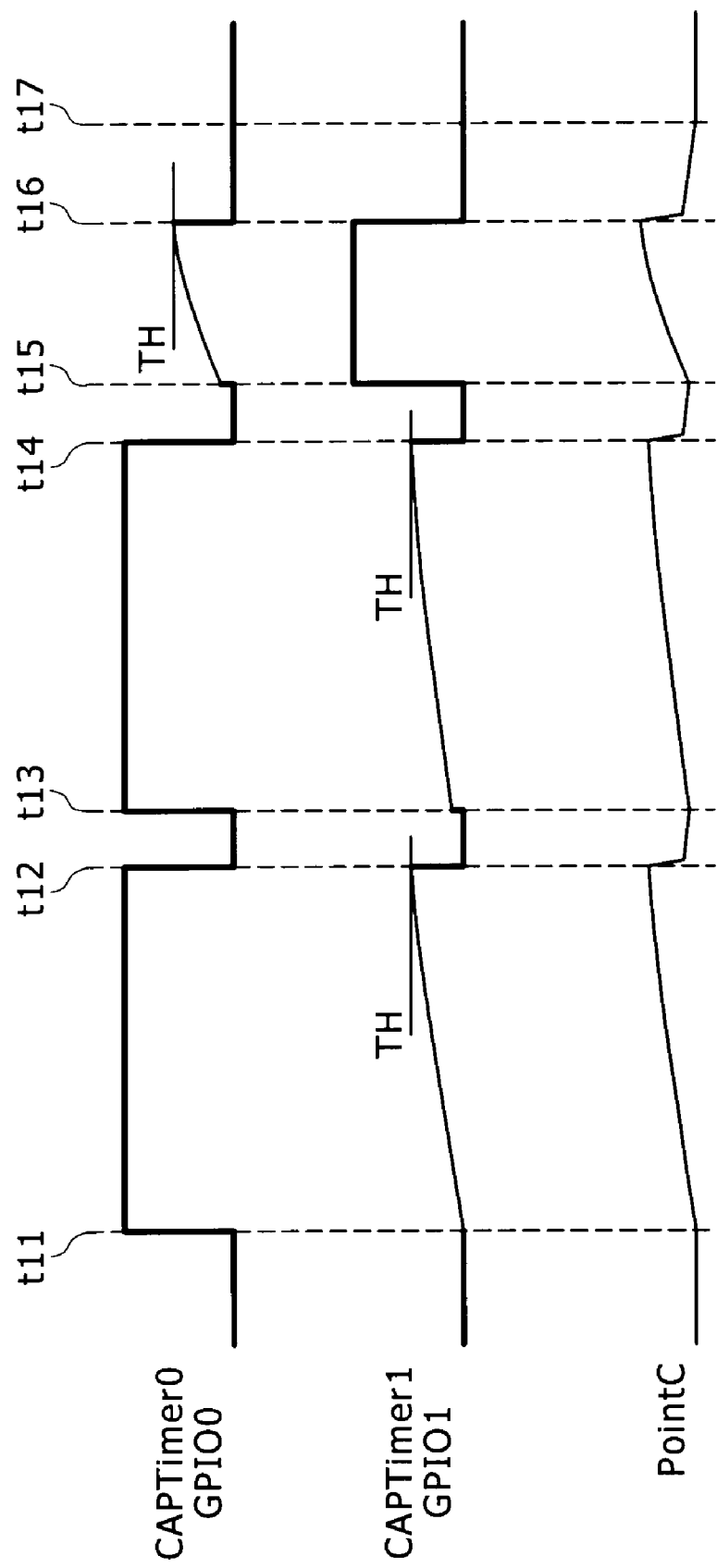
FIG. 10 is a timing diagram used to describe the operation of the second embodiment.

A description will be given below of the operation of the second embodiment of the present invention with reference to FIG. 10. FIG. 10 illustrates the states of the I/O ports GPIO0 (CAPTimer0) and GPIO1 (CAPTimer1). Further, FIG. 10 illustrates the change of the terminal voltage of the capacitor C. Each port is specified by the CPU of the information processing device 1 to be in output or input state. When in output state, the I/O port outputs high or low level. When in input state, the I/O port is in high impedance state. In FIG. 10, the periods of the waveforms during which the ports are in output state are shown by bold lines, and the periods of the waveforms during which the ports are in input state are shown by fine lines.

In the second embodiment, a precharge is performed first, followed by the measurement of the charge times of the reference charge/discharge circuit and charge/discharge circuit to be measured. During the period prior to time t11, a low level is output from both of the I/O ports GPIO0 and GPIO1. This period is a discharge period during which the capacitor C is discharged.

Next, at time t11, the I/O port GPIO0 is pulled up to high level, and the other I/O port GPIO1 is placed in input state (high impedance state). As the I/O port GPIO0 rises to high level, the capacitor C is charged via the reference resistor Rref. As a result of the charge, a terminal voltage Vc of the capacitor C increases gradually with the time constant determined by the reference resistor Rref and capacitor C.

At time t12, the voltage fed to the I/O port GPIO1 (CAPTimer1) reaches the threshold TH. As a result, the CPU of the information processing device 1 detects a transition of the input of the I/O port GPIO1 (CAPTimer1) from low to high level. At time t12, the CPU changes the I/O ports GPIO0 and GPIO1 to low level. This causes the charge stored in the capacitor C to be discharged via the diode D and I/O port GPIO0.

The forward voltage drop of the diode D does not fully discharge the charge stored in the capacitor C. As a result, there is some charge left in the capacitor C. The reference charge time is measured in this condition. At time t13 in a predetermined time from time t12, the I/O port GPIO0 is pulled up to high level, and the other I/O port GPIO1 is placed in input state (high impedance state). As the I/O port GPIO0 rises to high level, the capacitor C is charged via the reference resistor Rref. As a result of the charge, the terminal voltage Vc of the capacitor C increases gradually with the time constant determined by the reference resistor Rref and capacitor C.

At time t14, the voltage fed to the I/O port GPIO1 (CAPTimer1) reaches the threshold TH. As a result, the CPU of the information processing device 1 detects a transition of the input of the I/O port GPIO1 (CAPTimer1) from low to high level. At time t14, the CPU changes the I/O ports GPIO0 and GPIO1 to low level. This causes the charge stored in the capacitor C to be discharged via the diode D and I/O port GPIO0. The period t14 to t13 is the reference charge time Tref.

The forward voltage drop of the diode D does not fully discharge the charge stored in the capacitor C. As a result, there is some charge left in the capacitor C. The charge time of the charge/discharge circuit to be measured is measured in this condition. At time t15 in a predetermined time from time t14, the I/O port GPIO1 is pulled up to high level, and the other I/O port GPIO0 is placed in input state (high impedance state). As the I/O port GPIO1 rises to high level, the capacitor C is charged via the resistors connected in parallel with the key switches which are OFF (combined resistance Rx). As a result of the charge, the terminal voltage Vc of the capacitor C increases gradually with the time constant determined by the combined resistance Rx and capacitor C.

At time t16, the voltage fed to the I/O port GPIO0 (CAPTimer0) reaches the threshold TH. As a result, the CPU of the information processing device 1 detects a transition of the input of the I/O port GPIO0 (CAPTimer0) from low to high level. At time t16, the CPU changes the I/O ports GPIO0 and GPIO1 to low level. This causes the charge stored in the capacitor C to be discharged via the diode D and I/O port GPIO0. The period t16 to t15 is the charge time Tx.

Third Embodiment

Figure 11:
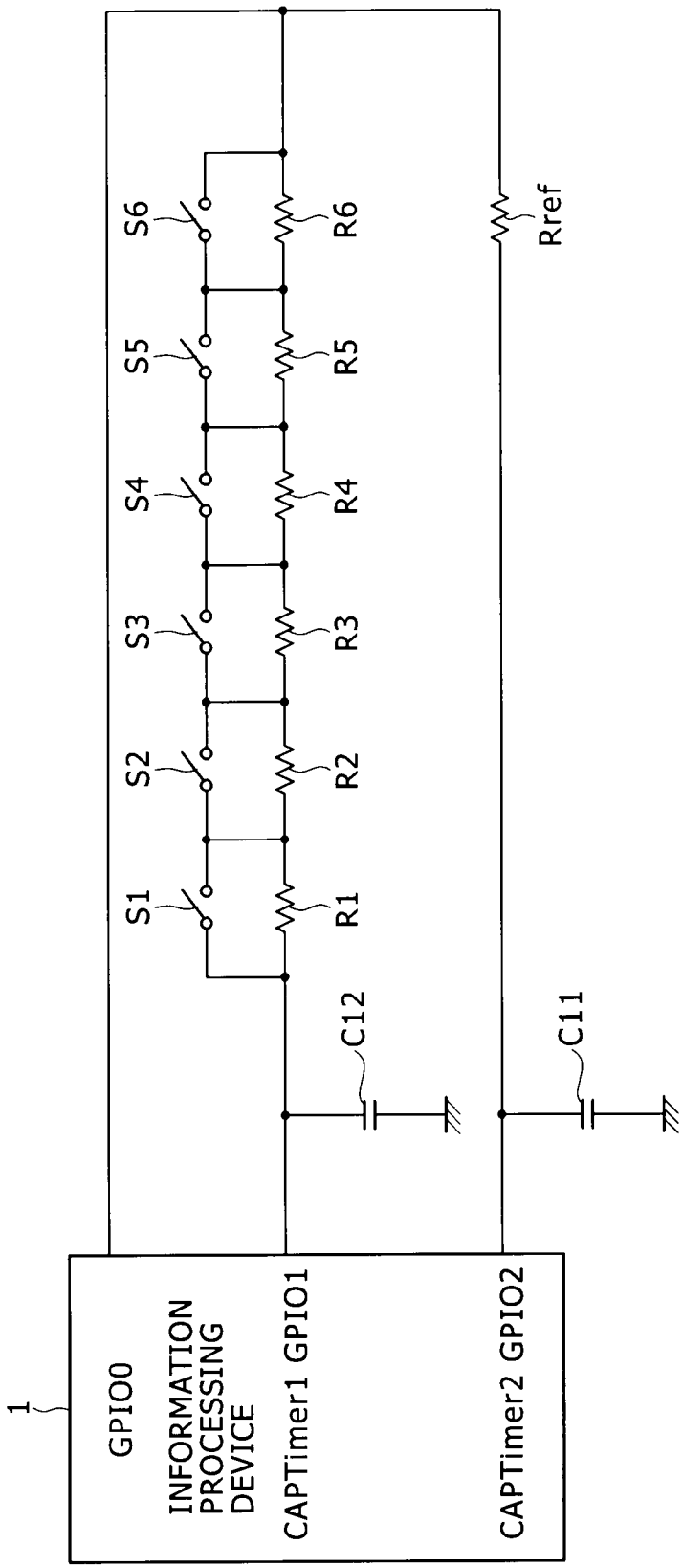
FIG. 11 is a connection diagram of a third embodiment of the present invention.

As illustrated in FIG. 11, the third embodiment is similar to the first embodiment in that the I/O ports GPIO0, GPIO1 and CAPTimer are used. A capacitor is provided for each of the two charge/discharge circuits, i.e., a capacitor C11 for the reference charge/discharge circuit and a capacitor C12 for the charge/discharge circuit to be measured. The capacitors C11 and C12 are adjusted to have the same capacitance. The difference in capacitance between the capacitors C11 and C12 is cancelled by signal processing (software processing).

Fourth Embodiment

Figure 12:
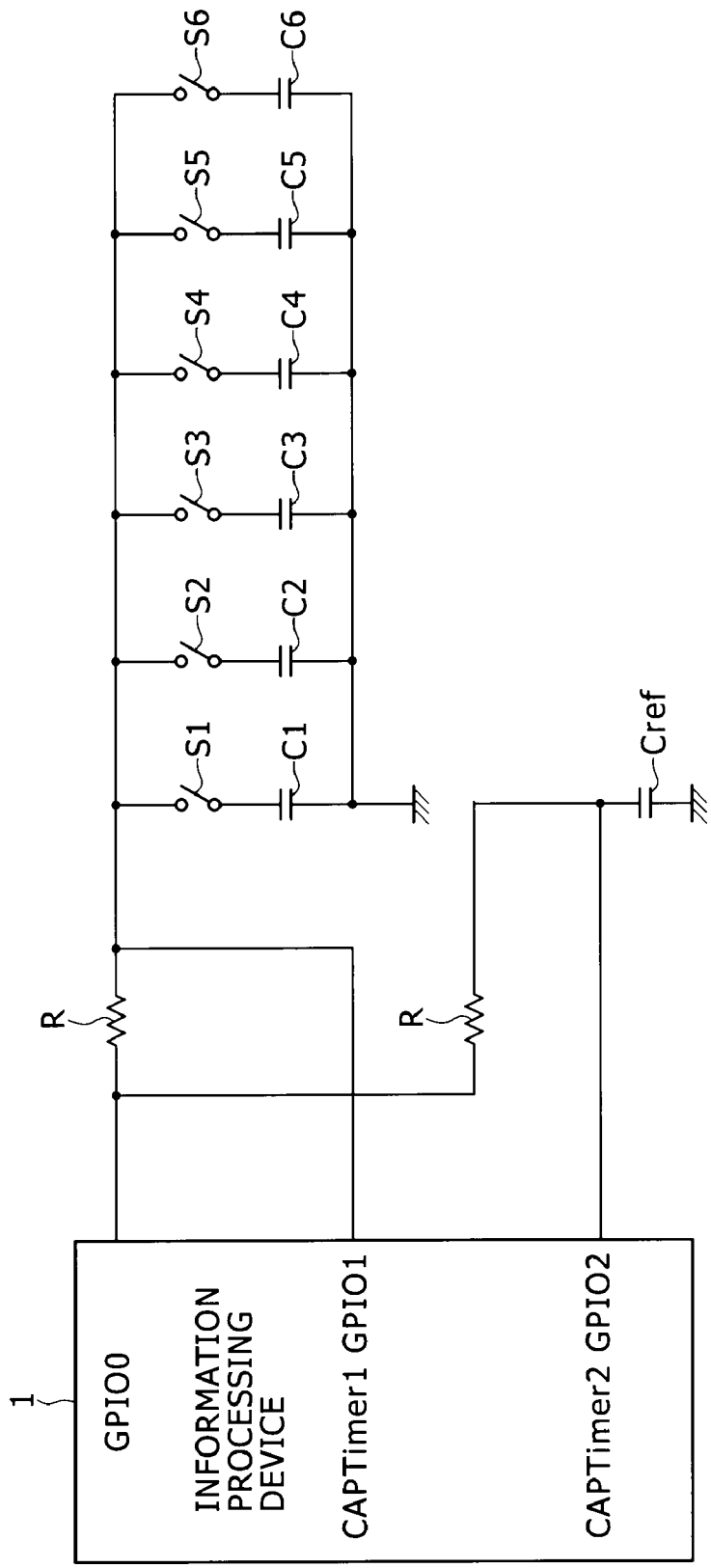
FIG. 12 is a connection diagram of a fourth embodiment of the present invention.

As illustrated in FIG. 12, the reference charge/discharge circuit includes a reference capacitor Cref having a fixed capacitance and a first resistor R. The charge/discharge circuit to be measured includes a plurality of capacitors C1 to C6, a plurality of switches S1 to S6 and a resistor R. The plurality of switches S1 to S6 are connected each in series with one of the capacitors C1 to C6.

The combined capacitances of the capacitors are in a one-to-one correspondence with the combinations of the operation statuses of the key switches S1 to S6. The combined capacitance of the capacitors can be found by measuring the charge times. The operation statuses of the switches S1 to S6 can be determined based on the combined capacitance.

Fifth Embodiment

Figure 13:
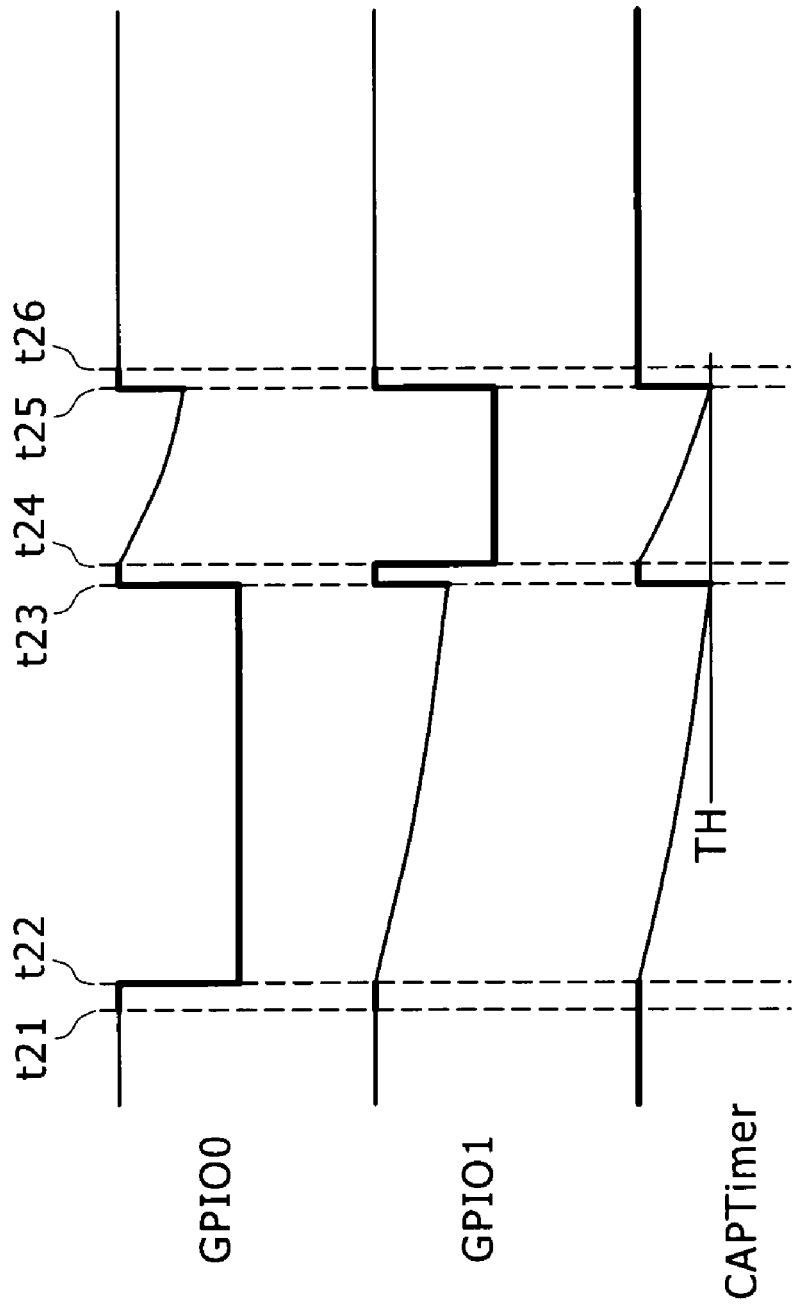
FIG. 13 is a timing diagram of a fifth embodiment of the present invention.

The aforementioned first to fourth embodiments are examples in which the charge times are measured. In the present invention, however, discharge times may be measured. FIG. 13 is a timing diagram for measuring the discharge times.

During the period from time t21 to time t22, a high level is output from all the I/O ports GPIO0, GPIO1 and CAPTimer. This period is a charge period during which the capacitor C is charged.

Next, at time t22, the I/O port GPIO0 is pulled down to low level, and the other I/O port GPIO1 and CAPTimer are placed in input state (high impedance state) As the I/O port GPIO0 falls to low level, the capacitor C is discharged via the reference resistor Rref. As a result of the discharge, the terminal voltage of the capacitor C (input voltage of the GPIO1 and CAPTimer) decreases gradually with the time constant determined by the reference resistor Rref and capacitor C.

At time t23, the voltage fed to the I/O port CAPTimer reaches the threshold TH. As a result, the CPU of the information processing device 1 detects a transition of the I/O port CAPTimer from high to low level. At time t23, the CPU changes all the I/O ports GPIO0, GPIO1 and CAPTimer to high level. This causes the capacitor C to be charged.

Next, at time t24, the I/O port GPIO1 is pulled down to low level, and the other I/O port GPIO0 and CAPTimer are placed in input state (high impedance state) As the I/O port GPIO1 falls to low level, the capacitor C is discharged via the resistors connected in parallel with the key switches which are OFF (combined resistance Rx). As a result of the discharge, the terminal voltage of the capacitor C (input voltage of the GPIO0 and CAPTimer) decreases gradually with the time constant determined by the combined resistance Rx and capacitor C.

At time t25, the voltage fed to the I/O port CAPTimer reaches the threshold TH. As a result, the CPU of the information processing device 1 detects a transition of the I/O port CAPTimer from high to low level. At time t25, the CPU changes all the I/O ports GPIO0, GPIO1 and CAPTimer to high level. This causes the capacitor C to be charged. The charge time is set to the length required for the capacitor to be charged.

Two discharge times, namely, the discharge time Tref (t23 to t22) required for the voltage during the discharge of the reference charge/discharge circuit to reach the threshold TH and the discharge time Tx (t25 to t24) required for the voltage during the discharge of the charge/discharge circuit to be measured to reach the threshold TH, are measured by the CPU. The ratio between the time constants can be found from the ratio between the discharge times. Because the capacitor C is shared between the two charge/discharge circuits, the ratio between the time constants is equal to the ratio between the discharge resistors. Thus, the combined resistance is found. As described earlier, the combined resistance Rx is associated with a combination of the operation statuses of the key switches S1 to S6. This allows for the information processing device 1 to determine the operation statuses of the key switches S1 to S6 from the combined resistance Rx.

[Relationship Between Number of Ports and Number of Key Switches]

Figure 14:
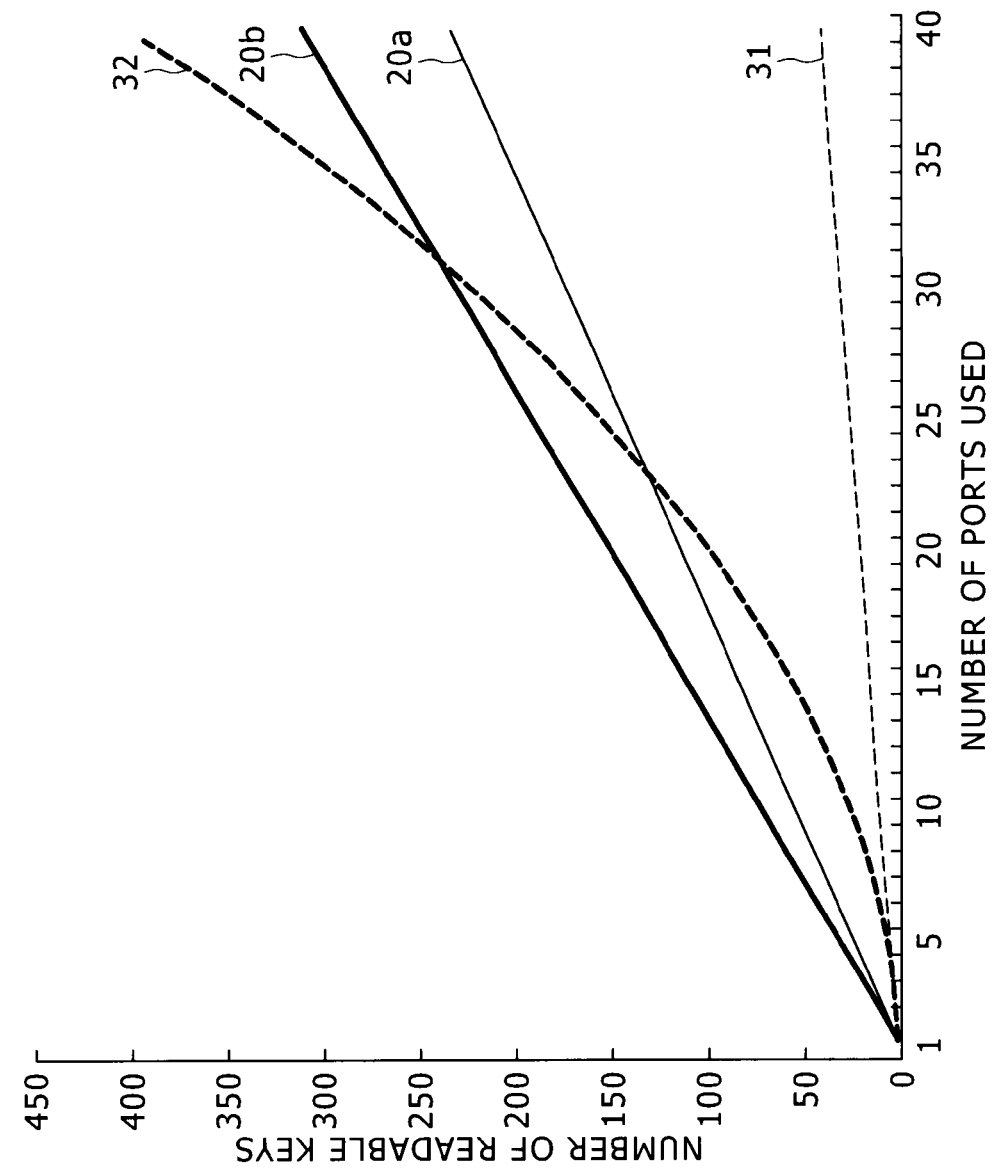
FIG. 14 is a graph illustrating the comparison results between the related art and present invention in terms of number of I/O ports required.

Comparison results between the related art and the present invention in terms of the number of ports required are shown in the graph of FIG. 14. The horizontal axis of the FIG. 14 represents the number of ports used, and the vertical axis thereof the number of readable key switches. In FIG. 14, lines 20a and 20b indicate the features of the present invention respectively when six and eight switches are assigned to each port. Further, line 31 indicate the feature of the first related art method (direct method), and line 32 the feature of the second related art method (key matrix).

According to the graph of FIG. 14, the present invention is probably advantageous over the related art methods as long as the number of key switches to be detected is from around 100 to 200. It is clear that the present invention is applicable to a large number of devices. The present invention can be installed to a general-purpose I/O port, making the invention widely applicable.

Modification Example

The present invention is applicable not only to operation switches provided on panels of electronic equipment but also to switch circuits made up of sensor switches provided inside equipment.

The present application contains subject matter related to that disclosed in Japanese Priority Patent Application JP 2008-265858 filed in the Japan Patent Office on Oct. 15, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A switch circuit comprising:
a first charge/discharge circuit having a fixed first time constant;
a second charge/discharge circuit having a second time constant associated with operation statuses of a plurality of switches and including a plurality of resistors and the plurality of switches, each of the switches connected in parallel only with one of the plurality of resistors;
first and second general purpose input/output (GPIO) ports to which the first and second charge/discharge circuits are connected, respectively; and
a control section adapted to measure the first and second time constants by charging or discharging the first and second charge/discharge circuits and determine the operation statuses of the plurality of switches based on a ratio of the measured first and second time constants.

2. The switch circuit of claim 1, wherein
the control section measures the first and second time constants via the first and second input/output ports.

3. The switch circuit of claim 1, wherein
the control section includes a third input/output port and measures the first and second time constants via the third input/output port.

4. The switch circuit of claim 1, wherein
the first charge/discharge circuit includes a reference resistor having a fixed resistance and a first capacitor,
the second charge/discharge circuit includes a series circuit having the plurality of resistors and a second capacitor, and
combined resistances of the plurality of resistors are in a one-to-one correspondence with the operation statuses of the plurality of switches.

5. The switch circuit of claim 4, wherein
resistances of each of the plurality of resistors differ from each other and are each a power of 2.

6. The switch circuit of claim 4, wherein
a single common capacitor is used as the first and second capacitors.

7. The switch circuit of claim 6, wherein
an element adapted to form a discharge path of the common capacitor is connected in parallel with the reference resistor.

8. The switch circuit of claim 1, wherein
the first charge/discharge circuit includes a reference capacitor having a fixed capacitance and a first resistor, and
the second charge/discharge circuit includes a plurality of capacitors, a plurality of switches which are each connected in series with one of the capacitors, and a second resistor.

9. The switch circuit according to claim 1, wherein
a determined operation status of two or more of the plurality of switches is on.

10. The switch circuit according to claim 1, wherein
the combined resistances of the plurality of resistors are in a one-to-one correspondence with every combination of operation statuses of the plurality of switches.

11. The switch circuit according to claim 1, wherein
combinations of a switch and a resistor connected in parallel with the switch are connected in series with each other.

12. The switch circuit according to claim 1, wherein
the control section measures the second time constant by determining a time period between when the second charge/discharge circuit begins to charge or discharge and when an input to the second GPIO port changes from one binary input to another binary input.

* * * * *